(12) United States Patent
Erickson et al.

(10) Patent No.: US 8,435,851 B2
(45) Date of Patent: May 7, 2013

(54) IMPLEMENTING SEMICONDUCTOR SOC WITH METAL VIA GATE NODE HIGH PERFORMANCE STACKED TRANSISTORS

(75) Inventors: Karl R. Erickson, Rochester, MN (US); Phil C. Paone, Rochester, MN (US); David P. Paulsen, Dodge Center, MN (US); John E. Sheets, II, Zumbrota, MN (US); Gregory J. Uhlmann, Rochester, MN (US); Kelly L. Williams, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 91 days.

(21) Appl. No.: 13/005,089

(22) Filed: Jan. 12, 2011

(65) Prior Publication Data
US 2012/0175626 A1 Jul. 12, 2012

(51) Int. Cl.
*H01L 21/8238* (2006.01)
(52) U.S. Cl.
USPC ........... 438/212; 438/153; 438/156; 257/330; 257/332; 257/350; 257/E29.262
(58) Field of Classification Search ............ 257/66, 257/67, 69, 328, 329, 330, 332, 350, 351, 257/E29.262; 438/153, 156, 212
See application file for complete search history.

(56) References Cited

U.S. PATENT DOCUMENTS

| 5,208,172 A | 5/1993 | Fitch et al. |
| 2003/0136978 A1* | 7/2003 | Takaura et al. ............... 257/210 |
| 2007/0194450 A1 | 8/2007 | Tyberg et al. |

OTHER PUBLICATIONS

"Implementing Vertical Signal Repeater Transistors Utilizing Wire Vias as Gate Nodes", U.S. Appl. No. 13/005,059, filed on the same day herewith, by Karl Robert Erickson et al.

* cited by examiner

*Primary Examiner* — Tucker Wright
(74) *Attorney, Agent, or Firm* — Joan Pennington

(57) ABSTRACT

A method and structures are provided for implementing metal via gate node high performance stacked vertical transistors in a back end of line (BEOL) on a semiconductor System on Chip (SoC). The high performance stacked vertical transistors include a pair of stacked vertical field effect transistors (FETs) formed by polycrystalline depositions in a stack between planes of a respective global signal routing wire. A channel length of each of the stacked vertical FETs is delineated by the polycrystalline depositions with sequential source deposition, channel deposition and drain deposition; and a wire via defines the gate node.

6 Claims, 9 Drawing Sheets

IMPLEMENTING SEMICONDUCTOR SOC WITH METAL VIA GATE NODE HIGH PERFORMANCE STACKED TRANSISTORS

FIELD OF THE INVENTION

The present invention relates generally to the data processing field, and more particularly, relates to a method and structures for implementing metal via gate node high performance stacked vertical transistors in a back end of line (BEOL) on a semiconductor System on Chip (SoC).

DESCRIPTION OF THE RELATED ART

As the content and most importantly the processor or core count as well as the core to core communication bandwidth requirements on a chip die grows the fundamental limit to integration tends to be in the wiring planes.

Modern semiconductor chips, operating at very high frequencies, often have signal paths that have to drive significantly long distances from a first circuit to a second circuit on the chip. Unfortunately, chip wiring is quite resistive as well as capacitive, and therefore long chip signal routing may cause unacceptable delays and signal degradation. To reduce effects of the resistive and capacitive effects, long signal paths are often broken up into segments, with buffers or signal repeaters between segments. Long wiring routes are typically provided on relatively high wiring levels or many wiring levels above the chip silicon substrate. Via stacks route wiring segments up to the high wiring level and back down again to buffers or signal repeaters, or a destination circuit, on the silicon substrate. Via stacks are quite resistive and create delays in buffered, segmented, long signal routes.

Of particular concern are long and broad communication channels that require a significant number of signal repeaters as the signal traverses down the wire path between distant cores. The connection from the long wire down to and back from transistor repeaters down in the silicon plane are extremely problematic as the intervening planes all must be utilized to reach the silicon plane. These vertical wire topologies not only tie up significant wire resources they also add significant impedance to the path, often exceeding the long wire resistance or the repeater impedance itself.

U.S. patent application Publication No. 2007/0194450 published on Aug. 23, 2007 to Tyberg et al., and assigned to the present assignee, discloses structures and a fabrication process for incorporating thin film transistors in back end of the line (BEOL) interconnect structures. The structures and fabrication processes described are compatible with processing requirements for the BEOL interconnect structures. The structures and fabrication processes utilize existing processing steps and materials already incorporated in interconnect wiring levels in order to reduce added cost associated with incorporating thin film transistors in the these levels. The structures enable vertical (3D) integration of multiple levels with improved manufacturability and reliability as compared to prior art methods of 3D integration.

A need exists for an effective mechanism for implementing high performance stacked vertical transistors in a back end of line (BEOL) on a semiconductor System on Chip (SoC) fabricated in the stack between the planes of the global signal routing wire.

SUMMARY OF THE INVENTION

Principal aspects of the present invention are to provide a method and structures for implementing metal via gate node high performance stacked vertical transistors in a back end of line (BEOL) on a semiconductor System on Chip (SoC). Other important aspects of the present invention are to provide such method and structures substantially without negative effects and that overcome many of the disadvantages of prior art arrangements.

In brief, a method and structures are provided for implementing metal via gate node high performance stacked vertical transistors in a back end of line (BEOL) on a semiconductor System on Chip (SoC). The high performance stacked vertical transistors include a pair of stacked vertical field effect transistors (FETs) being formed by polycrystalline depositions in a stack between planes of a respective global signal routing wire. A channel length of each of the pair of stacked vertical FETs being delineated by the polycrystalline depositions with sequential source deposition, channel deposition and drain deposition; and a wire via defines the gate node of each of the pair of stacked vertical FETs.

In accordance with features of the invention, the pair of stacked vertical FETs includes high performance N-channel field effect transistors (NFET) and a P-channel field effect transistor (PFET).

In accordance with features of the invention, an output via defines an output connection to each of the pair of stacked vertical FETs.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Signals on modern semiconductor chips that must travel relatively long distances, such as a millimeter or more, are becoming performance limiting factors as data processing circuitry on the chips becomes faster. Signal wiring on chips tends to be quite resistive, with distributed capacitance, as well as what is typically a lumped capacitive load at the receiving end of the signal wiring. Signals are both delayed and degraded when travelling along such a resistive-capacitive signal wire. The usual technique to minimize total signal delay on a long route has been to buffer the signal one or more times along the route. Modern semiconductor chips may have twelve, or more wiring levels above the silicon substrate. Vias to take a signal up, and back down twelve or more wiring levels amounts to a large resistance, since vias are relatively resistive.

In an exemplary technology, a signal wire on an $8^{th}$ level wiring level may be, with worst case process conditions, 0.3 ohms/micron. A 500 micron signal wire would therefore have 150 ohms of resistance. A via between wiring levels might be, worst case, 34 ohms. Typically, redundant vias are used; for example, four vias between the wider wires on higher-up wiring levels and two vias between the narrower wires on wiring levels nearer the silicon substrate. Contacts to the silicon levels may be 400 ohms and are typically two contact redundant. A via stack up to the $8^{th}$ level may be as much as approximately 400 ohms, which is larger than the 150 ohms of the 500 micron signal wire. Then, to get back down to a buffer circuit is another 400 ohms. Buffers or signal repeaters placed near the $8^{th}$ level (again using the $8^{th}$ level only for example) would reduce the resistance by 800 ohms. Longer wiring routes on the $8^{th}$ level could be used for the same total resistance, or, resistance between buffers can be dramatically reduced by placing buffers near the $8^{th}$ wiring level.

Figure 9:
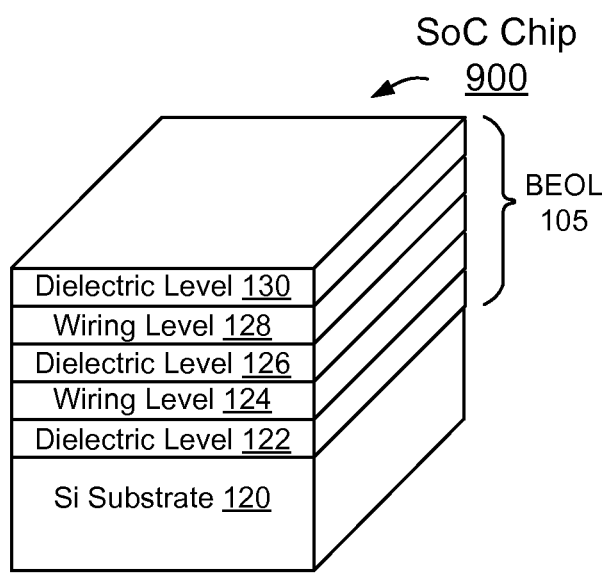
FIG. 9 shows a semiconductor chip implementing a semiconductor System on Chip (SoC) having a silicon substrate and a plurality of dielectric levels and wiring levels, the plurality of dielectric levels and wiring levels forming a global wiring region used for implementing stacked vertical transistors in accordance with the preferred embodiment.

Referring also to FIG. 9 there is shown an example semiconductor chip 900 having a silicon substrate 120 and a back end of the line (BEOL) 105 including a plurality of dielectric levels 122, 126, 130 and a plurality of wiring levels 124, 128 sandwiched in between the dielectric levels. Semiconductor chip 900 implements a semiconductor System on Chip (SoC) with metal via gate node high performance stacked transistors fabricated in a back end of line (BEOL) 105 in accordance with features of the invention. The plurality of dielectric levels 122, 126, 130 and wiring levels 124, 128 forms a global wiring region advantageously used for implementing vertical transistors in accordance with the preferred embodiment. Although only three dielectric levels and two wiring levels are shown for simplicity, it should be understood that modern semiconductor chips may have twelve or more wiring levels.

Figure 1:
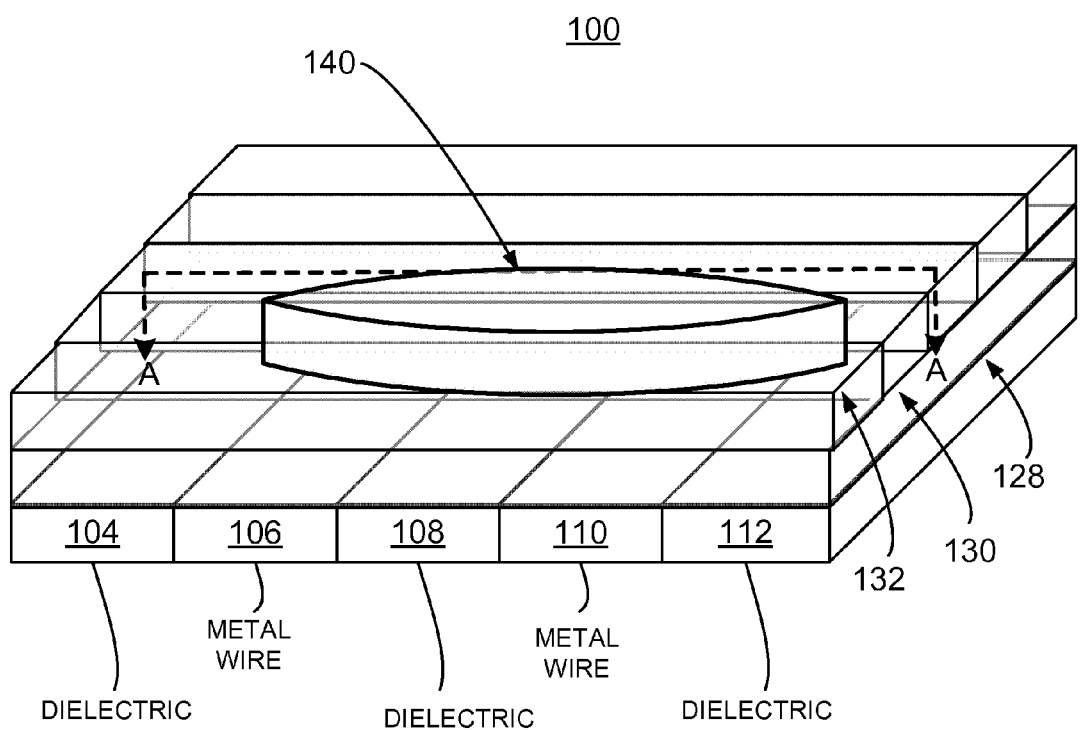
FIG. 1 shows an isometric view of a first and second wiring level of a semiconductor chip, and a dielectric level sandwiched in between the wiring levels, with a metal-metal device opening extending through the dielectric level with a cross section line indicating a cross section used in subsequent figures for implementing stacked vertical transistors utilizing wire vias as gate nodes in accordance with the preferred embodiment.

Referring now to FIG. 1, there is shown an isometric view of example global signal routing planes generally designated by the reference character 100 in accordance with the preferred embodiment. The global signal routing planes 100 include the first and second wiring levels 128, 132, N and N+1, and the dielectric level 130 including one or more dielectrics deposited between the metal levels per typical processing. A metal-metal device opening or hole 140 is etched extending through the dielectric level 130 to the wiring level 128 with a cross section line A-A indicating a cross section used in subsequent figures for implementing NFET and PFET stacked vertical transistors utilizing wire vias as gate nodes in accordance with the preferred embodiment. A pair of stacked vertical NFETs and PFETs are formed in the metal-metal device opening 140, which is a generally large; for example, approximately 0.10 micro-meter (μm)-0.25 μm opening in the dielectric 130, a subset of the area ultimately to be the N to N+1 metal signal input gate via and a second subset over one existing ground wire, also on level N.

In accordance with features of the invention, polycrystalline depositions are utilized in the physical plane of copper or refractory metal vias to form stacked high performance vertical field effect transistors suitable for wire signal repeating, design error correction (EC), or other logical functions without the use of silicon level transistors and eliminating the need for the nominally required vertical stack of wires and vias down to and back up from the silicon level providing connections to conventional silicon level transistors.

The present invention enables high performance transistor fabrication up in the stack between the planes of the global signal routing wire in the back end of line (BEOL) 105 of SoC chip 900 as shown in FIG. 9 with metal via gate nodes for the high performance stacked transistors. The high performance transistor fabrication utilizes a respective vertical via extending between wire planes 128, 132 as shown in FIG. 1 as both an electrical input signal connection and the gate node of the novel stacked vertical transistors of the invention. This invention provides enhanced vertical stacked transistors by utilizing an easily controlled vertical structure.

The BEOL wiring level 128 includes a plurality of signal conductors or metal wires 106, 110 with a plurality of adjacent dielectric material spacers 104, 108, 112. The signal conductors or metal wires 106, 110 are formed of any suitable electrically conductive material, for example, of Cu, Al, Al (Cu), and W. The dielectric material spacers 104, 108, 112 are formed of any suitable dielectric material compatible with the semiconductor fabrication process, which may be silicon dioxide SiO2 or a low-K dielectric, depending on a particular process selected for fabricating the silicon SoC chip 900 as shown in FIG. 9. The metal wires 106, 110 as shown in FIG. 1 including the plurality of adjacent dielectric material spacers 104, 108, 112 of the BEOL wiring level 128 run perpendicular to the metal lines of the BEOL wiring level 132.

The BEOL wiring level 128 illustrates a typical on die global wire route like those used between distinct cores on a system on a chip (SoC), utilizing a wire plane 128, N running horizontally and a wire plane 132, N+1 running vertically over the semiconductor surface. The via electrically connecting planes 128, 132 N and N+1 is our focus here with the via used to form the respective gate of the fabricated stacked NFETs and PFETs of the invention.

Figure 2:
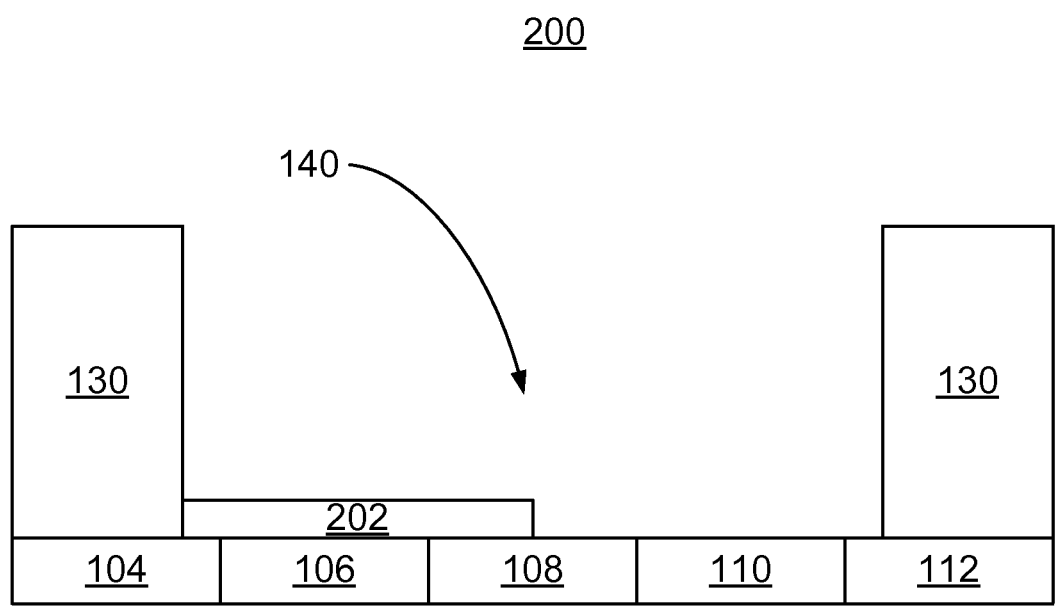
FIGS. 2, 3, 4, 5, 6, 7, and 8 illustrate exemplary processing steps for fabricating the stacked vertical transistors utilizing wire vias as gate nodes in accordance with the preferred embodiment.

Referring to FIG. 2, in processing steps generally designated by the reference character 200 begin with the etched hole 140 created over two signal conductors or metal wires 106, 110, which is etched through dielectric level 130 as illustrated in FIG. 1. A timed etch determines depth of etched hole 140. A relatively thin dielectric 202 is deposited to be selectively patterned to prevent shorting of the bottom of the polycrystalline stack to the N level metal input signal wire 106.

In accordance with features of the invention, polycrystalline depositions including polysilicon depositions and epitaxial depositions or other semiconductor deposition techniques and including other suitable semiconductor materials are utilized in the transistor fabrication process. The transistor channel length is delineated by the deposition of doped silicon with sequential source, channel and drain depositions. This allows extremely tight tolerances and affords us a far more aggressive nominal transistor design point. The vertical transistor fabrication advantageously starts with a relatively thin, polysilicon deposition, as a seed layer deposition then is switched to an epitaxial deposition to enhance the crystalline properties of the semiconductor, most importantly in the channel region.

Figure 3:
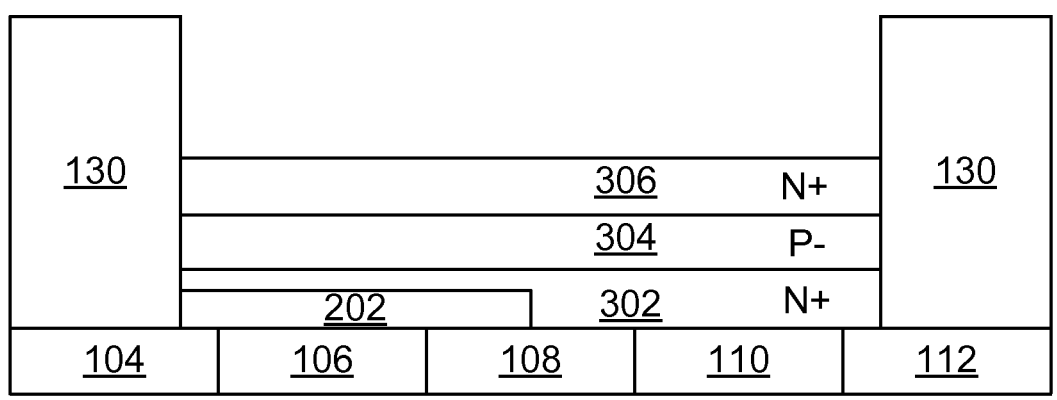

Referring to FIG. 3, in processing steps generally designated by the reference character 300 to create an NFET a N+ doped polysilicon 302 of thickness on the order of 0.1 µm is deposited, defining an NFET source or N Source, a P-doped polysilicon 304 of thickness on the order of 0.05 µm is deposited, defining an NFET body or N body, and a N+ doped polysilicon 306 of thickness on the order of 0.1 µm is deposited, defining an NFET drain or N Drain.

Figure 4:
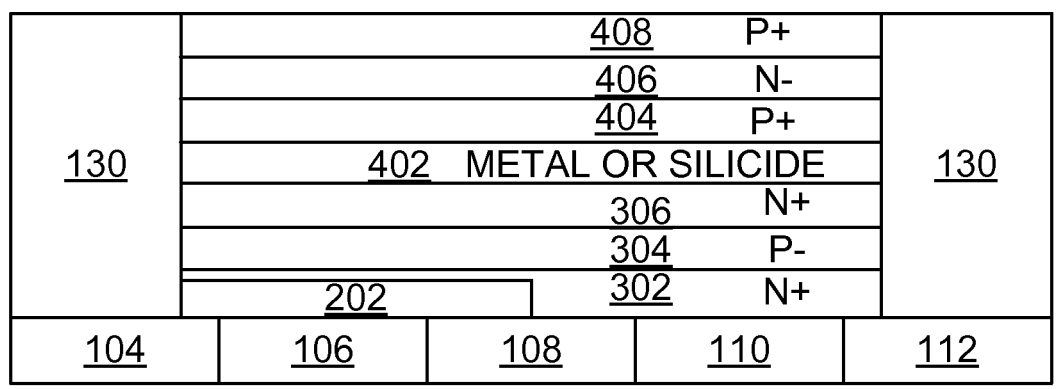

Referring to FIG. 4, there are shown processing steps generally designated by the reference character 400. In processing steps 400, first a metal or silicide conductive material 402 is deposited for ohmic contact and etch stop, to create a PFET a P+ doped polysilicon 404 of thickness on the order of 0.1 µm is deposited, defining a PFET source or P Source, a N− doped polysilicon 406 of thickness on the order of 0.05 µm is deposited, defining a PFET body or P body, and a P+ doped polysilicon 408 of thickness on the order of 0.1 µm is deposited, defining a PFET drain or P Drain.

Figure 5:
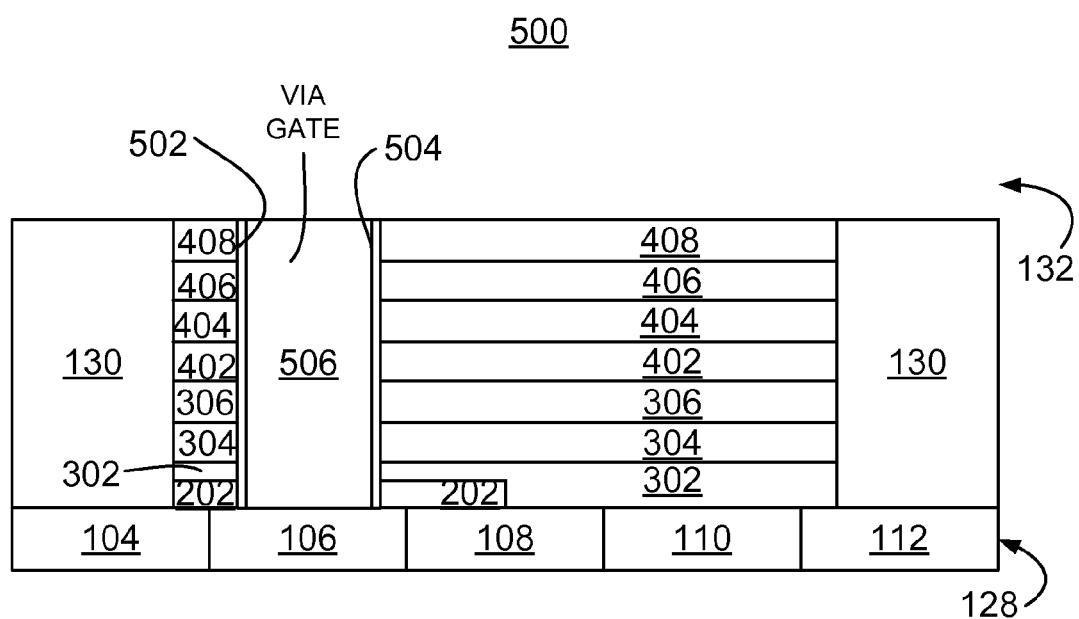

Referring to FIG. 5, in processing steps generally designated by the reference character 500 to create the via gate, the polysilicon outside the intended opening 140 is polished off, a via opening 502 is etched down to the wiring level 128 and the signal wire 106, a thin (20-30 Angstrom) dielectric oxide 504 is deposited in the via opening 502, then anisotropically blanket etching removes the deposited dielectric oxide from the bottom of via opening to the input signal wire 106; removing only a subset of the dielectric 504 on the sidewalls, and a selected metal fill 506 is deposited in the lined via opening 502, such as copper or desired other metal defining a via gate 506. The via gate 506 is positioned between metal lines or wires in the wiring layer 132, N+1 such that the via gate does not make contact with these metal wires, which run perpendicular to the metal signal and ground wires 106, and 110 in the wiring layer 128.

Figure 6:
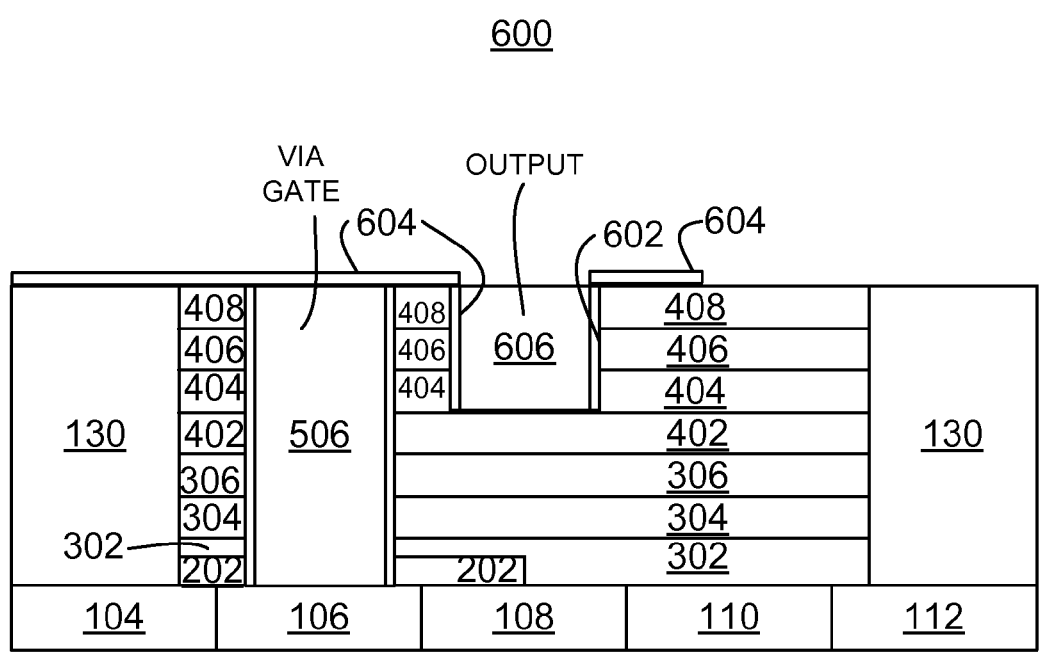

Referring to FIG. 6, in processing steps generally designated by the reference character 600 to create an output via, a via opening 602 is etched down to the metal/silicide 402, a thin (20-30 Angstrom) dielectric oxide 604 is deposited over the stack and inside the via opening 602, then anisotropically blanket etching removes the deposited dielectric oxide 604 from a portion above the stack and the bottom of via opening to the metal/silicide 402; removing only a subset of the dielectric 604 on the stack and the sidewalls, and an output via 606 is defined by a selected metal fill 606, such as copper or desired other metal deposited in the dielectric oxide lined via opening 602.

Figure 7:
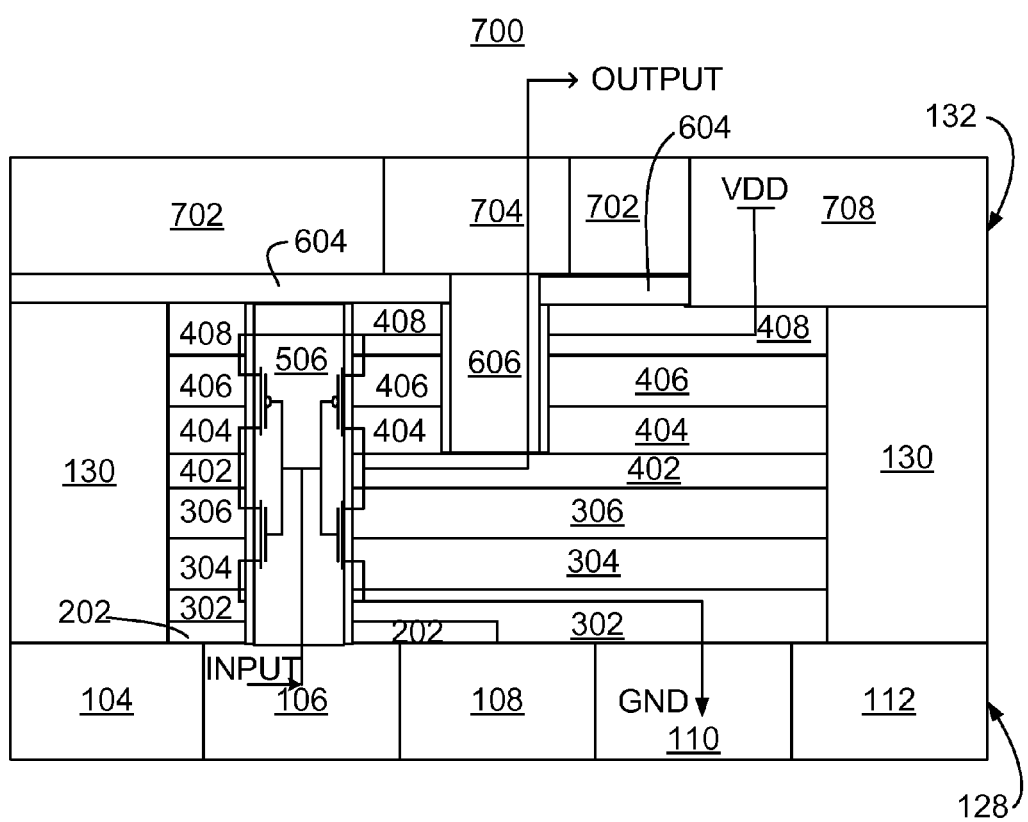

Referring to FIG. 7 which includes a final device schematic overlay, processing steps generally designated by the reference character 700 are shown to create the final stacked vertical transistors structure. A mask pattern is provided to remove silicon above the P drains 408 on a subset of the polysilicon donut, and a dielectric 702 is added, and an output metal 704 extends over the output via 606, with NFET drain 306 and PFET source 404 connections at a common junction connection of the series connected stacked NFET and PFET made to the metal output 704. NFET source connection 302 is made to an existing GND rail metal wire 110 in wiring level 128, N and PFET drain connection 408 is made to a VDD metal wire 708 in wiring level 132, N+1.

Figure 8:
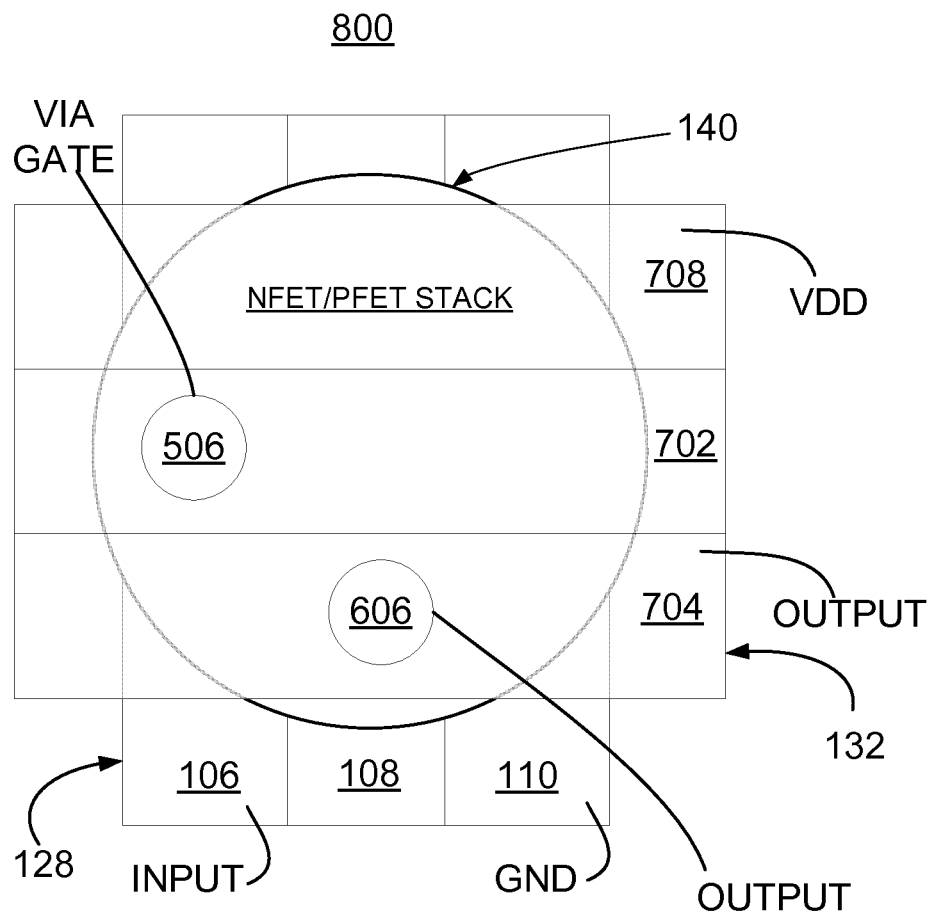

Referring to FIG. 8, a top down connections view generally designated by the reference character 800 illustrates connections to the stacked NFET and PFET including input metal 106, and the via gate 506, VDD metal 708, and ground GND METAL 110, output metal 704, and the via output 606.

The metal level stacked vertical NFETs and PFETs of the invention also advantageously are used for late design changes, similar to the existing BEOL release process but with little or no real estate area implications and far fewer new masks required than conventional processes.

While the present invention has been described with reference to the details of the embodiments of the invention shown in the drawing, these details are not intended to limit the scope of the invention as claimed in the appended claims.

What is claimed is:

1. A method for implementing stacked vertical transistors in a back-end-of-line (BEOL) structure on a semiconductor System on Chip (SoC) comprising: forming a pair of stacked vertical field effect transistors (FETs) by polycrystalline depositions in a stack between planes of a respective global signal routing wire in the back-end-of-line (BEOL) structure; said polycrystalline depositions of each of said pair of stacked vertical FETs including sequential source deposition, channel deposition and drain deposition; and forming a wire via defining a gate node of each of said pair of stacked vertical FETs by forming an etched hole through said source deposition, channel deposition and drain deposition, and an ohmic contact, and a dielectric layer to a signal wire in the BEOL stack; depositing a thin dielectric in said etched opening, and removing said thin dielectric from a bottom of said etched opening, and depositing a metal in said etched opening.

2. The method as recited in claim 1 wherein said pair of stacked vertical field effect transistors (FETs) includes a stacked N-channel field effect transistor (NFET) and a P-channel field effect transistor (PFET).

3. The method as recited in claim 2 wherein said polycrystalline depositions of each of said pair of stacked vertical FETs include a sequential deposition of an N+ doped polysilicon defining a N source, a P− doped polysilicon defining a N body, and an N+ doped polysilicon defining a N drain, depositing an ohmic contact on said NFET N+ doped polysilicon drain deposition; and a sequential deposition of a P+ doped polysilicon defining a P source, an N− doped polysilicon defining a P body, and a P+ doped polysilicon defining a P drain.

4. The method as recited in claim 2 includes forming a wire via for defining an output via connected to a common connection of a series connected pair of said NFET and said PFET.

5. The method as recited in claim 3 wherein sequential source deposition, channel deposition and drain deposition of said NFET and said PFET has a respective thickness of approximately 0.1 µm, 0.05 µm, and 0.1 µm.

6. A method for implementing stacked vertical transistors in a back-end-of-line (BEOL) structure comprising:
forming a pair of stacked vertical field effect transistors (FETs) being formed by polycrystalline depositions in a stack between planes of a respective global signal routing wire; said polycrystalline depositions of each of said pair of stacked vertical FETs including a sequential deposition of an N+ doped polysilicon defining a N source, a P− doped polysilicon defining a N body, and an N+ doped polysilicon defining a N drain, depositing an ohmic contact on said NFET N+ doped polysilicon drain deposition; and a sequential deposition of a P+ doped polysilicon defining a P source, an N− doped polysilicon defining a P body, and a P+ doped polysilicon defining a P drain
said polycrystalline depositions of each of said pair of stacked vertical FETs including sequential source deposition, channel deposition and drain deposition; and forming a wire via defining a gate node of each of said pair of stacked vertical FETs includes forming an etched hole through said source deposition, channel deposition and drain deposition of said NFET and said PFET, and said ohmic contact, and a dielectric layer to a signal wire in the BEOL stack; depositing a thin dielectric in said etched opening, and removing said thin dielectric from a bottom of said etched opening, and depositing a metal in said etched opening.

* * * * *